US011318495B2

(12) United States Patent
Hasegawa et al.

(10) Patent No.: US 11,318,495 B2
(45) Date of Patent: May 3, 2022

(54) FILM FORMING METHOD

(71) Applicant: FUJIFILM Corporation, Tokyo (JP)

(72) Inventors: Masataka Hasegawa, Minami-ashigara (JP); Hayato Kanazawa, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/906,432

(22) Filed: Jun. 19, 2020

(65) Prior Publication Data

US 2020/0316643 A1 Oct. 8, 2020

Related U.S. Application Data

(63) Continuation of application No. PCT/JP2018/045400, filed on Dec. 11, 2018.

(30) Foreign Application Priority Data

Dec. 22, 2017 (JP) ............................ JP2017-246151

(51) Int. Cl.
*B05D 1/02* (2006.01)
*B05D 3/12* (2006.01)
(Continued)

(52) U.S. Cl.
CPC ................. *B05D 3/12* (2013.01); *B05D 1/02* (2013.01); *G02F 1/13* (2013.01); *B05D 3/06* (2013.01); *C23C 24/04* (2013.01)

(58) Field of Classification Search
CPC .......... B05D 3/044; B05D 3/06; B05D 3/067; B05D 3/12; B05D 1/02; B05D 1/28;
(Continued)

(56) References Cited

U.S. PATENT DOCUMENTS

2008/0317943 A1 12/2008 Hirai

FOREIGN PATENT DOCUMENTS

CN 101330801 A 12/2008
JP 2005072473 A * 3/2005
(Continued)

OTHER PUBLICATIONS

Japanese Office Action for Japanese Application No. 2019-560989, dated Jun. 15, 2021, with English translation.
(Continued)

*Primary Examiner* — Alexander M Weddle
(74) *Attorney, Agent, or Firm* — Birch, Stewart, Kolasch & Birch, LLP

(57) ABSTRACT

An object of the present invention is to provide a film forming method capable of forming a film by an aerosol deposition with high accuracy patterning. The object of the present invention is achieved by aerosolizing a raw material liquid including a film forming material; supplying the aerosol to a base material; and forming a film of the film forming material on the base material, in which the base material has, on a film forming surface, a liquid-repellent region which has liquid repellency to the raw material liquid and a lyophilic region which has lyophilicity to the raw material liquid, and in a case where a width of the liquid-repellent region is L and a diameter of the aerosol is D, "D>L" is satisfied.

9 Claims, 2 Drawing Sheets

(51) Int. Cl.

| | |
|---|---|
| ***G02F 1/13*** | (2006.01) |
| *B05D 3/06* | (2006.01) |
| *C23C 24/04* | (2006.01) |

(58) Field of Classification Search
CPC .. B05D 1/60; B05D 1/322; G02F 1/13; C23C 14/22; C23C 24/00; C23C 24/04
See application file for complete search history.

(56) References Cited

FOREIGN PATENT DOCUMENTS

| | | | | | |
|---|---|---|---|---|---|
| JP | 2007-27536 | A | | 2/2007 | |
| JP | 2007027536 | A | * | 2/2007 | |
| JP | 2013-28480 | A | | 2/2013 | |
| WO | WO 2013/176222 | A1 | | 11/2013 | |
| WO | WO-2013176222 | A1 | * | 11/2013 | ............. H05B 33/02 |

OTHER PUBLICATIONS

International Preliminary Report on Patentability dated Jul. 2, 2020 and English translation of the Written Opinion of the International Searching Authority dated Feb. 5, 2019 (PCT/IB/326, PCT/IB/373 and PCT/ISA/237) for Application No. PCT/JP2018/045400.

International Search Report (PCT/ISA/210) dated Feb. 5, 2019 for Application No. PCT/JP2018/045400 with an English translation.

Chinese Office Action and Search Report for corresponding Chinese Application No. 201880081409.7, dated Nov. 25, 2021, with English translation.

* cited by examiner

FILM FORMING METHOD

CROSS-REFERENCE TO RELATED APPLICATIONS

This application is a Continuation of PCT International Application No. PCT/JP2018/045400 filed on Dec. 11, 2018, which claims priority under 35 U.S.C. § 119(a) to Japanese Patent Application No. 2017-246151 filed on Dec. 22, 2017. The above application is hereby expressly incorporated by reference, in its entirety, into the present application.

BACKGROUND OF THE INVENTION

1. Field of the Invention

The present invention relates to a film forming method by an aerosol deposition.

2. Description of the Related Art

As a film forming technique of thin film, a technique for forming a film from a film forming material by aerosolizing a raw material liquid including the film forming material, supplying the generated aerosol to a base material by transporting the generated aerosol with a carrier gas, and vaporizing a solvent in the aerosol adhering to the base material has been known. The technique for forming a film is also called an aerosol deposition.

In the aerosol deposition, a film is formed using very small aerosol compared to liquid droplets in a film formation such as ink-jet and spray coating.

Therefore, according to the aerosol deposition, a film having high following property (coverage property) to an unevenness and the like of the base material and having a uniform thickness can be precisely formed.

In the film formation by the ink-jet, the liquid droplets can be selectively landed on a target position. For example, in the ink-jet, a wiring pattern can be formed by landing ink liquid droplets according to a target wiring pattern.

In contrast, in the aerosol deposition, basically, the aerosol is supplied substantially uniformly over the entire surface of the base material. That is, in the aerosol deposition, it is not possible to selectively form a film on a desired position on the base material.

In contrast, it has been proposed that a film is formed in a desired region of the base material using the aerosol deposition to form a film according to a wiring pattern or the like, by forming a liquid-repellent region having liquid repellency to the raw material liquid and a lyophilic region having lyophilicity to the raw material liquid on the base material with a pattern.

For example, WO2013/176222A discloses a device manufacturing method comprising: a step of forming a functional layer in which lyophilicity and liquid repellency are modified by irradiation with light energy on a surface of a base material (substrate); a light patterning step of generating a pattern imparted with contrast due to lyophilicity and liquid repellency by irradiating patterned light energy to the functional layer on the base material; and a deposition step of converting a functional solution including molecules or particles of a material substance for an electronic device into aerosol (mist) and of spraying gas in which the aerosol is mixed with a carrier gas onto the surface of the base material which has been treated in the light patterning step.

SUMMARY OF THE INVENTION

As disclosed in WO2013/176222A, by forming a lyophilic region and a liquid-repellent region on a base material, it is possible to suppress adhesion of aerosol to the liquid-repellent region and selectively adhere the aerosol only to the lyophilic region.

Therefore, by forming a liquid-repellent region and a lyophilic region on a base material according to a target pattern of a film, the film having the target pattern can be formed by the aerosol deposition.

As described above, the aerosol served for the film formation by the aerosol deposition is very small compared to liquid droplets such as the ink-jet.

Therefore, in many cases, a target pattern cannot be formed with high accuracy even though the liquid-repellent region and the lyophilic region are formed on the base material with a pattern.

An object of the present invention is to solve such problems in the related art, and is to provide a film forming method capable of performing a film formation of a target pattern with high accuracy by an aerosol deposition.

In order to solve the problems, the present invention has the following configuration.

[1] A film forming method comprising:
- aerosolizing a raw material liquid including a film forming material;
- supplying the aerosol to a base material; and
- forming a film of the film forming material on the base material,
- in which the base material has, on a film forming surface, a liquid-repellent region which has liquid repellency to the raw material liquid and a lyophilic region which has lyophilicity to the raw material liquid, and
- in a case where a width of the liquid-repellent region is L and a diameter of the aerosol is D, "$D \geq L/2$" is satisfied.

[2] The film forming method according to [1], in which the aerosol is supplied to the base material while vibrating the base material.

[3] The film forming method according to [1] or [2], in which the aerosol is supplied to the base material while heating the base material.

[4] The film forming method according to [3], in which the base material is heated such that a temperature of a surface of the base material is 100° C. or higher.

[5] The film forming method according to [3] or [4], in which a boiling point of a solvent or a dispersion medium included in the raw material liquid is 100° C. or lower.

[6] The film forming method according to any one of [1] to [5], in which the lyophilic region and the liquid-repellent region of the base material are formed by performing lyophilic treatment on an entire film forming surface of the base material and then forming a pattern having liquid repellency to the raw material liquid.

[7] The film forming method according to any one of [1] to [6], in which "$D \geq L$" is satisfied.

[8] The film forming method according to any one of [1] to [7], in which the lyophilic region and the liquid-repellent region form a wiring pattern.

[9] The film forming method according to [8], in which the wiring pattern is a line-and-space wiring pattern.

[10] The film forming method according to any one of [1] to [9], in which the film forming material is a conductive material.

According to the film forming method of the present invention, it is possible to form a film having a target pattern with high accuracy by an aerosol deposition.

DESCRIPTION OF THE PREFERRED EMBODIMENTS

Figure 1:
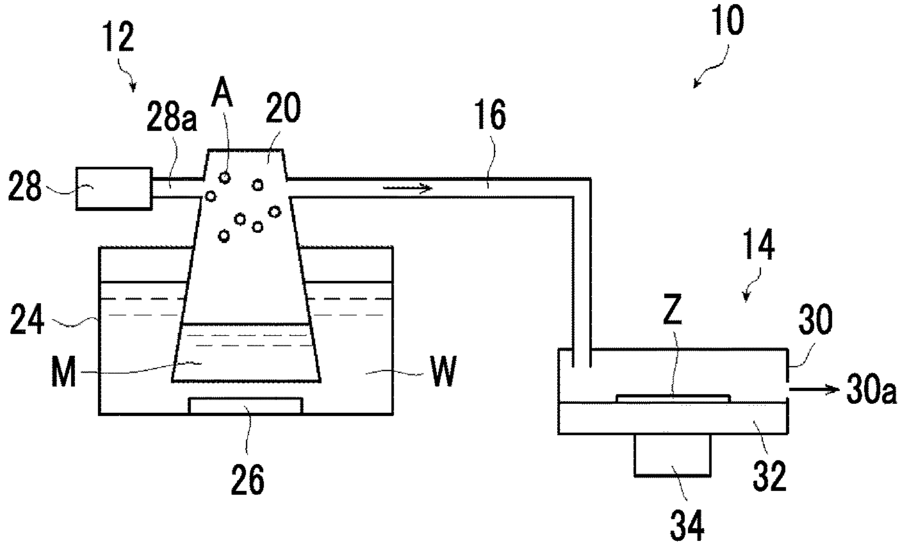
FIG. 1 is a conceptual view for describing an example of a film forming method of the present invention.

Hereinafter, the film forming method according to an embodiment of the present invention will be described in detail based on suitable embodiments shown in the accompanying drawings.

The embodiments described below exemplify an example of the present invention, and the scope of the present invention is not limited thereto. In addition, in order to clarify the description of each constitutional member, the dimensions of each constitutional member in the drawings are appropriately changed. Therefore, the scale in the drawings is different from the actual one.

Furthermore, in the present specification, a numerical range represented by using "to" means a range including numerical values described before and after "to" as a lower limit value and an upper limit value.

FIG. 1 conceptually shows an example of a film forming apparatus for the film forming method according to the embodiment of the present invention.

The film forming apparatus 10 shown in FIG. 1 is an apparatus for forming a film on a base material Z by the above-described aerosol deposition, and has an aerosol generating portion 12 and a film forming portion 14. The aerosol generating portion 12 and the film forming portion 14 are connected by a guide pipe 16.

As described later, the film forming method according to the embodiment of the present invention uses a base material Z which has a lyophilic region having lyophilicity to a raw material liquid M and has a liquid-repellent region having liquid repellency to the raw material liquid M, and in a case where the width of the liquid-repellent region is L and the diameter of aerosol A is D, the film forming method according to the embodiment of the present invention satisfies "$D \geq L/2$" (refer to FIG. 2). Except for satisfying the condition, the film forming method according to the embodiment of the present invention basically forms a film in the same manner as a known aerosol deposition (mist deposition).

Therefore, the film forming apparatus 10 and the like shown in FIG. 1 are basically a known apparatus for forming a film by the aerosol deposition. In addition to the members shown in the drawings, the film forming apparatus 10 may have various members included in the known apparatus for forming a film by the aerosol deposition, such as supply means for the raw material liquid M, collecting means for the aerosol A (raw material liquid M) which does not serve for the film formation, and purifying means for carrier gas.

In the following description, the lyophilic region and the liquid-repellent region formed on the base material Z are conveniently referred to as a "lyophilic/repellent pattern".

The aerosol generating portion 12 aerosolizes the raw material liquid M which is obtained by dissolving or dispersing a film forming material in a solvent or a dispersion medium, and supplies the generated aerosol A to the guide pipe 16. The aerosol A is sent to the film forming portion 14 through the guide pipe 16.

In the film forming apparatus 10, the aerosol generating portion 12 has a raw material container 20 containing the raw material liquid M, a container 24 containing a part of the raw material container 20, an ultrasonic vibrator 26 disposed on a bottom surface of the container 24, and a gas supply means 28 supplying the carrier gas for sending the aerosol A to the film forming portion 14 through the guide pipe 16.

Water W is contained in the container 24. The water W is contained in the container 24 in order to transmit ultrasonic waves generated by the ultrasonic vibrator 26 to the raw material liquid M. Therefore, the ultrasonic vibrator 26 is immersed in the water W. In addition, at least a part of the container 24 containing the raw material container 20 is also immersed in the water W.

In a case where the ultrasonic vibrator 26 vibrates, the water W propagates the ultrasonic vibration so as to ultrasonically vibrate the raw material container 20, thereby ultrasonically vibrating the raw material liquid M contained in the raw material container 20. By ultrasonically vibrating the raw material liquid M, the raw material liquid M is aerosolized and the aerosol A of the raw material liquid M is generated. That is, the raw material container 20, the container 24, and the ultrasonic vibrator 26 constitute a so-called ultrasonic atomizer.

In the film forming method according to the embodiment of the present invention, the method for ultrasonically vibrating the raw material liquid M is not limited to the method for ultrasonically vibrating the raw material liquid M by propagating ultrasonic waves using the water W, that is, an intermediate solution. For example, a known method used for ultrasonic vibration of the raw material liquid M in the aerosol deposition can be used, such as a method for ultrasonically vibrating the raw material liquid M through the raw material container 20 by disposing the ultrasonic vibrator 26 on a lower surface of the raw material container 20, and a method for ultrasonically vibrating the raw material liquid M directly by disposing the ultrasonic vibrator 26 on a bottom surface of the raw material container 20.

In the film forming method according to the embodiment of the present invention, the film forming material (film to be formed) is not limited, and various materials which can be formed into a film by the aerosol deposition can be used.

Examples thereof include liquid crystal compounds, organic electroluminescent materials, metal alkoxide compounds, silicon compounds such as silicon dioxide (silica) and tetraethoxysilane, ceramic powders such as lead zirconate titanate (PZT) and aluminum oxide (alumina), metal oxides of zinc, alumina, zirconia, silica, perovskite, and the like, transparent electrode materials such as indium tin oxide (ITO), silver halide, and metal nanoparticles, polysaccharides such as gelatin, polyvinyl alcohol, polyvinyl pyrrolidone, starch, water-soluble resins such as cellulose and derivatives thereof, polyethylene oxide, polyvinyl amine, chitosan, polylysine, polyacrylic acid, polyalginic acid, polyhyaluronic acid, and carboxy cellulose, molecules which become oxide semiconductors and organic semiconductors, and carbon nanotubes.

Among these, transparent electrode materials such as indium tin oxide, silver halide, and metal nanoparticles and conductive materials used for a wiring on a substrate of a semiconductor device and the like, such as carbon nanotubes, can be suitably used as the film forming material in the present invention.

The solvent or the dispersion medium used in the preparation of the raw material liquid M is not limited, and according to the film forming material, various liquids can be used as long as a liquid can dissolve or disperse the film forming material.

Examples thereof include organic solvents, for example, amides such as N,N-dimethylformamide, sulfoxides such as dimethyl sulfoxide, heterocyclic compounds such as pyridine, hydrocarbons such as benzene and hexane, alkyl halides such as chloroform and dichloromethane, esters such as methyl acetate and butyl acetate, ketones such as acetone, methyl ethyl ketone, methyl isobutyl ketone, and cyclohexanone, ethers such as tetrahydrofuran and 1,2-dimethoxyethane, alkyl alcohols such as methanol, ethanol, and propanol, and the like. In addition, water is also exemplified as the solvent or dispersion medium. It is preferable to use any one of ion exchange water, distilled water, and pure water as the water.

The solvent and the dispersion medium may be used as a mixture of two or more thereof.

As described later, in the film forming method according to the embodiment of the present invention, for the purpose of moving the aerosol A on the base material Z by Leidenfrost effect, it is preferable that aerosol is supplied to the base material Z while heating the base material Z.

On the other hand, the film forming method according to the embodiment of the present invention forms a film on the base material Z having the lyophilic/repellent pattern, but in a case where drying of the aerosol A proceeds by heating, the effect of the lyophilic/repellent pattern is reduced.

In consideration of this point, it is preferable that the solvent (dispersion medium) used in the preparation of the raw material liquid M is a liquid having a boiling point of 100° C. or lower.

The raw material liquid M may include various binders and coupling agents as necessary for the purpose of improving adhesiveness of the film after the film formation, improving the film hardness, and the like.

In addition, the raw material liquid M may include a polymerizable monomer as necessary in order to increase the film hardness of the film to be formed.

The ultrasonic vibrator 26 is not limited, and various ultrasonic vibrators (generating means for ultrasonic vibration) used for aerosolizing (misting) the raw material liquid M in the aerosol deposition can be used.

The frequency of the ultrasonic vibration by the ultrasonic vibrator 26 is also not limited, and it is sufficient that the frequency of the ultrasonic vibration, which can aerosolize the raw material liquid M, is appropriately set according to composition and the like of the raw material liquid M. The frequency of the ultrasonic vibration for aerosolizing the raw material liquid M is approximately 15 kHz to 3 MHz.

As described later, in the film forming method according to the embodiment of the present invention, the width L of the liquid-repellent region in the lyophilic/repellent pattern and the diameter D of aerosol satisfy "D≥L/2".

In the aerosol deposition, the diameter D of the aerosol A can be adjusted by adjusting one or more of density (concentration) of the raw material liquid M, surface tension of the raw material liquid M, and frequency of the ultrasonic vibration.

In the film forming method according to the embodiment of the present invention, the aerosolization of a raw material liquid M is not limited to the ultrasonic vibration of the raw material liquid M, and various known aerosolizing method for the raw material liquid M, which are used in the aerosol deposition, can be used.

Examples of the aerosolizing method include a pressuring type, a rotating disk type, an orifice vibration type, and an electrostatic type. The pressuring type is a method of aerosolization by colliding a liquid with a gas having increased flow velocity by applying pressure. The rotating disk type is a method in which liquid dropped on a high-speed rotating disk is aerosolized at an edge of the disk by centrifugal force. The orifice vibration type is a method in which liquid droplets are cut and aerosolized by applying vibration at the time of passing the liquid droplets through an orifice having fine holes. The electrostatic type is a method in which liquid is aerosolized by applying a DC or AC voltage to a thin tube through which liquid droplets pass.

The gas supply means 28 is a means for introducing the carrier gas into the raw material container 20 through a gas supply pipe **28*a*. By the carrier gas supplied from the gas supply means 28, the aerosol A floating in the raw material container 20 is transported from the raw material container 20 to the film forming portion 14 through the guide pipe 16**.

The gas supply means 28 is not limited, various known gas supply means used for supplying the carrier gas in the aerosol deposition, such as a fan, a blower, a gas cylinder, and compressed air, can be used. Alternatively, the carrier gas may be supplied to the raw material container 20 by suction from an outlet **30*a* of the film forming portion 14** described later.

The supply amount of gas by the gas supply means 28 is not also limited. Here, it is preferable that the gas supply means 28 supplies the carrier gas so that gas flow in the raw material container 20, the guide pipe 16, and the film forming portion 14 (in a casing 30 described later) is a laminar flow. In a case where the gas flow including aerosol becomes the laminar flow, a film having a uniform thickness can be formed on the surface of the base material Z.

The supply amount of the carrier gas in the gas supply means 28 is preferably $3\times10^{-3}$ to $5\times10^{-3}$ $m^3$/min and more preferably $1\times10^{-3}$ to $3\times10^{-3}$ $m^3$/min.

In the film forming method according to the embodiment of the present invention, the carrier gas is not limited, and various known gases used as a carrier gas in the aerosol deposition, such as inert gas of argon, nitrogen, and the like, air, gas obtained by aerosolizing the film forming material, and gas obtained by aerosolizing another film forming material, can be used.

On the other hand, the film forming portion 14 has a casing 30, a support 32 supporting the base material Z, and a vibration device 34. The support 32 is disposed in the casing 30.

The vibration device 34 is provided as a preferred embodiment, and in the drawings, is abutted and fixed to a lower surface of the casing 30. In addition, as a preferred embodiment, the support 32 incorporates heating means.

In the film forming method according to the embodiment of the present invention, the base material Z is not limited, and various materials which are used as a base material in the film formation by the aerosol deposition can be used.

Examples thereof include a resin film consisting of a resin material such as polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, poly(methyl methacrylate) resin (PMMA), polycarbonate (PC), polyacrylate, polymethacrylate, polypropylene (PP), polystyrene (PS), acrylonitrile-butadiene-styrene copolymer (ABS), cycloolefin copolymer (COC), cycloolefin polymer (COP), triacetyl cellulose (TAC), and ethylene-vinyl alcohol copolymer (EVOH), and biodegradable film composed of polylactic acid, polyglycolic acid, chitin, chitosan, and the like.

In addition, as the base material Z, microchannel chip base materials such as micro-total analysis systems (μTAS), various circuit base materials on a silicon wafer, biotemplate base materials, and the like can also be used. That is, in the film forming method according to the embodiment of the present invention, various members having unevenness on the surface can be used as the base material Z.

In the film forming method according to the embodiment of the present invention, before forming a film on the base material Z, a film forming surface of the base material Z may be subjected to a surface treatment as necessary.

As the surface treatment of the base material Z, various treatments performed in the aerosol deposition according to the types of the solvent (dispersion medium) included in the raw material liquid M and the film forming material can be used. Examples thereof include a rubbing treatment for imparting alignment to the base material Z in a case of forming a film of a liquid crystal compound. The general method of the rubbing treatment is described in, for example, "Handbook of Liquid crystals" (published by Maruzen, Oct. 30, 2000).

Furthermore, as the surface treatment of the base material Z, formation of a base layer can also be used for the purpose of improving adhesiveness, ensuring surface smoothness, and the like. It is sufficient that a known method such as a coating method and a printing method is performed for the formation of a base layer according to the base layer to be formed.

In the film forming method according to the embodiment of the present invention, the base material Z has the lyophilic/repellent pattern in which the lyophilic region having lyophilicity to the raw material liquid M and the liquid-repellent region having liquid repellency to the raw material liquid M are formed on the film forming surface.

In the present invention, having lyophilicity refers to that a contact angle between the film forming surface of the base material Z and the raw material liquid M is less than 90°. On the other hand, having liquid repellency refers to that the contact angle between the film forming surface of the base material Z and the raw material liquid M is 90° or more.

The contact angle can be measured, for example, using a commercially available device such as DropMaster700 manufactured Kyowa Interface Science Co., Ltd. in accordance with JIS R 3257.

Figure 2:
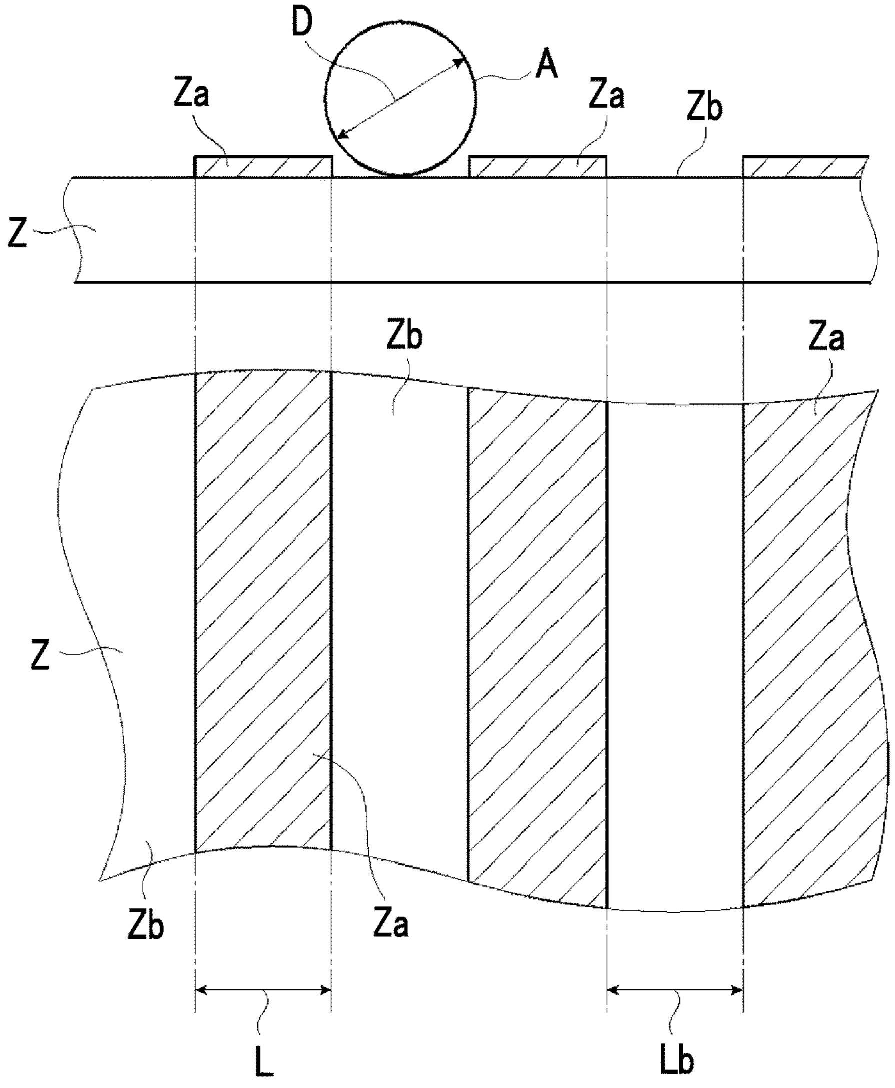
FIG. 2 is a conceptual view for describing an example of the film forming method of the present invention.

In the film forming method according to the embodiment of the present invention, as conceptually shown in FIG. 2, the lyophilic/repellent pattern formed on the base material Z corresponds to, for example, a wiring pattern formed on a substrate of a semiconductor device and the like, and is a so-called line-and-space pattern.

In FIG. 2, the upper part is a view of the base material Z as viewed from a surface direction of main surface, and is a view as viewed in the same direction as FIG. 1. In addition, the lower part is a view of the base material Z as viewed from a direction orthogonal to the main surface, and is a view (plane view of the base material Z) showing the film forming surface of the base material Z. The main surface is the largest surface of a sheet-like material (a plate-like material and a film-like material).

As conceptually shown in FIG. 2, in the film forming method according to the embodiment of the present invention, in a case where the width of the liquid-repellent region Za in the lyophilic/repellent pattern is L and the diameter of the aerosol A is D, the width L of the liquid-repellent region Za and the diameter D of the aerosol A satisfy "D≥L/2". The diameter of the aerosol A is, in other words, the particle diameter (particle size) of the aerosol particles.

In the present invention, the width L of the liquid-repellent region Za is, in other words, the diameter of the largest inscribed circle inscribed in the liquid-repellent region Za.

Specifically, for example, in the width L of the liquid-repellent region Za, in a case where a lyophilic/repellent pattern formed on the base material Z is a line-and-space pattern corresponding to the wiring pattern, which is conceptually shown in FIG. 2, the diameter of the largest inscribed circle inscribed in the liquid-repellent region Za basically matches a line width of the linear liquid-repellent region Za.

In addition, in a case where the lyophilic/repellent pattern is a so-called sea-island like (sea-island structure) pattern in which the liquid-repellent region Za has an island-like lyophilic region Zb, the width L of the liquid-repellent region Za is the diameter of the largest inscribed circle which is not overlapped with the lyophilic region Zb and is inscribed in the liquid-repellent region Za, that is, the width L of the liquid-repellent region Za is the diameter of the largest circle which can be formed without overlapping the lyophilic region Zb in the region surrounded by a plurality of the lyophilic regions Zb. In this case, the shape of the island in the sea-island like lyophilic/repellent pattern is not limited, and various shapes such as polygonal shapes of a circle, an ellipse, a triangle, a quadrangle, and the like, and irregular shapes can be used.

Since the film forming method according to the embodiment of the present invention has such a configuration, in the film formation by the aerosol deposition to the base material Z on which the lyophilic/repellent pattern is formed, the adhesion and film formation of the aerosol A to the liquid-repellent region Za is suppressed, the aerosol A selectively adheres to the lyophilic region Zb, and a target pattern can be formed on the film with high accuracy.

As described above, unlike the ink-jet in which liquid droplets are selectively landed at a desired position on the base material, in the aerosol deposition, the aerosol A is uniformly supplied to the entire surface of the base material Z, and it is basically impossible to form a film having a desired pattern.

In contrast, as described in WO2013/176222A, by forming a lyophilic/repellent pattern on the film forming surface of the base material Z, it is possible to suppress the adhesion of the aerosol A to the liquid-repellent region, selectively adhere the aerosol A to the lyophilic region, and form a patterned film having a desired pattern.

The aerosol A is very small compared to liquid droplets in the ink-jet or the like. In addition, in the aerosol deposition, the film forming material forms a film on the base material Z by evaporating the solvent (dispersion medium) from the aerosol A adhering to the base material Z.

Therefore, in the aerosol deposition, in a case where the aerosol A is significantly smaller than the width L of the liquid-repellent region Za, the solvent evaporates from the aerosol A which is a very small liquid droplet during the aerosol A adhering to the liquid-repellent region Za moves from the liquid-repellent region Za to the lyophilic region Zb, thereby the film forming material forms a film on the liquid-repellent region Za.

In contrast, in the film forming method according to the embodiment of the present invention, the width L of the liquid-repellent region Za and the diameter D of the aerosol A satisfy "D≥L/2".

Therefore, in a case where the aerosol A reached the liquid-repellent region Za rolls one rotation, the aerosol A reaches the lyophilic region Zb and is retained in the lyophilic region Zb to form a film. Therefore, according to the film forming method according to the embodiment of the present invention, in the aerosol deposition, the adhesion and film formation of the aerosol A to the liquid-repellent region Za is suppressed, the aerosol A selectively adheres to the lyophilic region Zb, and a target patterned film is formed with high accuracy. That is, for example, in a case of a wiring pattern shown in FIG. 4, the aerosol A can appropriately adhere only to the position where the wiring is to be formed, and a wiring pattern can be formed with high accuracy.

In the film forming method according to the embodiment of the present invention, the width L of the liquid-repellent region Za and the diameter D of the aerosol A preferably satisfy "D≥L".

In a case where the width L of the liquid-repellent region Za and the diameter D of the aerosol A satisfy "D≥L", the adhesion and film formation of the aerosol A to the liquid-repellent region Za is more suitably suppressed, the aerosol A selectively adheres to the lyophilic region Zb more reliably, and a desired patterned film is formed with higher accuracy.

In the film forming method according to the embodiment of the present invention, the upper limit of the diameter D of the aerosol A is not limited. However, in a case where the diameter D of the aerosol A is too large, that is, the aerosol A is too large, the lyophilic region Zb cannot completely retain the aerosol A, and the aerosol A may reach the liquid-repellent region Za and the accuracy of patterning may be reduced.

In consideration of this point, it is preferable that the width L of the liquid-repellent region Za and the diameter D of the aerosol A satisfy "D≤2L". That is, in the film forming method according to the embodiment of the present invention, it is preferable that "2L≥D≥L/2" is satisfied.

Figure 4:
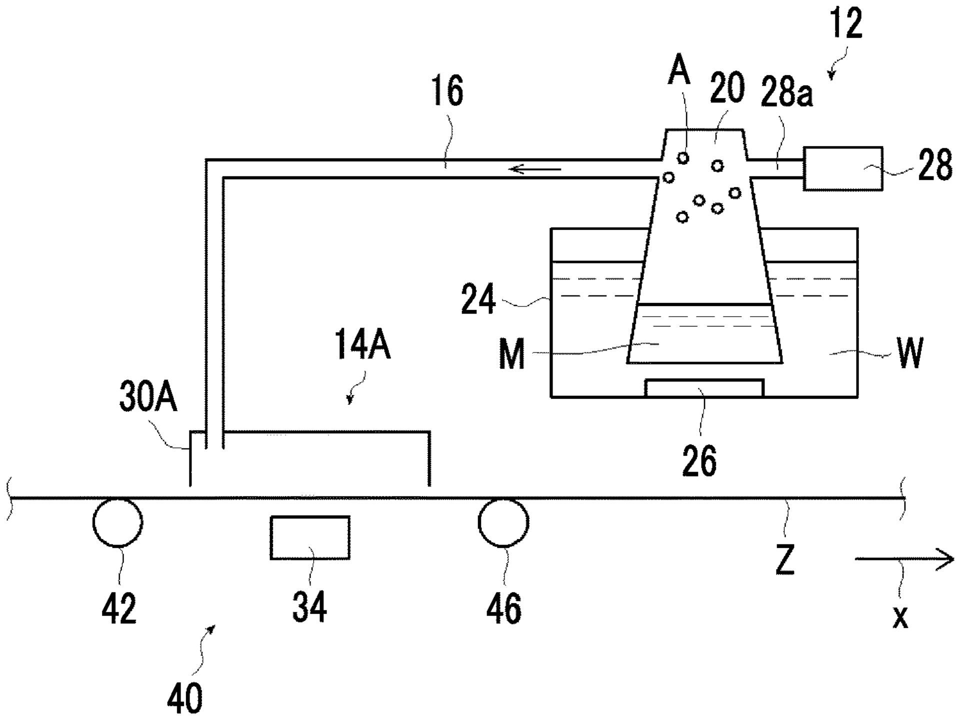
FIG. 4 is a conceptual view for describing another example of the film forming method of the present invention.

In particular, in a case where the lyophilic/repellent pattern is the line-and-space wiring pattern shown in FIG. 4, it is preferable that "D≤L+Lb" in which the width of a linear lyophilic region Zb is Lb is satisfied. That is, in this case, it is preferable that "L+Lb≥D≥L/2" is satisfied.

In the film forming method according to the embodiment of the present invention, the width L of the liquid-repellent region Za is not limited to a configuration in which the width L is uniform over the entire film formation region of the base material Z, and one or more portions of the base material Z may have portions (regions) in which the width L of the liquid-repellent region Za is different.

In the film forming method according to the embodiment of the present invention, it is sufficient that at least a part of the liquid-repellent region Za satisfies "D≥L/2".

However, in order to form a patterned film with high accuracy, it is preferable that 70% or more of the total area of the liquid-repellent region Za satisfies "D≥L/2", it is more preferable that 80% or more of the total area of the liquid-repellent region Za satisfies "D≥L/2", and it is particularly preferable that 99% or more of the total area of the liquid-repellent region Za satisfies "D≥L/2".

In the film forming method according to the embodiment of the present invention, the method for forming the lyophilic/repellent pattern, that is, the lyophilic region and the liquid-repellent region on the base material Z are not limited, and various known methods can be used according to composition of the raw material liquid M such as the forming material of the base material Z and the solvent (dispersion medium).

Examples thereof include a method forming a lyophilic pattern on a surface of the base material Z which has liquid repellency by a transcription, a plasma treatment, an ozone irradiation, an ultraviolet (UV) irradiation, a UV ozone irradiation, an electron beam (EB) irradiation, a photolithography, and the like, and a method forming a liquid-repellent pattern on a surface of the base material Z which has lyophilicity by a transcription, a gravure printing, an ink-jet, a photolithography, and the like.

The base material Z which has liquid repellency and the base material Z which has the lyophilicity may be the base material Z of which the surface is subjected to a liquid-repellent treatment to have liquid repellency or the base material Z of which the surface is subjected to a lyophilic treatment to have lyophilicity.

Examples of forming the lyophilic/repellent pattern on the base material Z include a method in which, in a case where the water is used as the solvent of the raw material liquid M, the entire surface of the base material Z is subjected to a hydrophilic treatment and then a water-repellent pattern formed by a water repellent is transferred to the liquid-repellent region Za.

For example, the entire surface of the base material Z is subjected to a UV ozone treatment and the hydrophilic treatment in advance. In addition, as conceptually shown in FIG. 3, an unevenness precursor 36 having unevenness according to a lyophilic/repellent pattern is prepared. In the unevenness precursor 36, convex portions *36a* correspond to the liquid-repellent region Za and concave portions *36b* correspond to the lyophilic region Zb.

Figure 3:
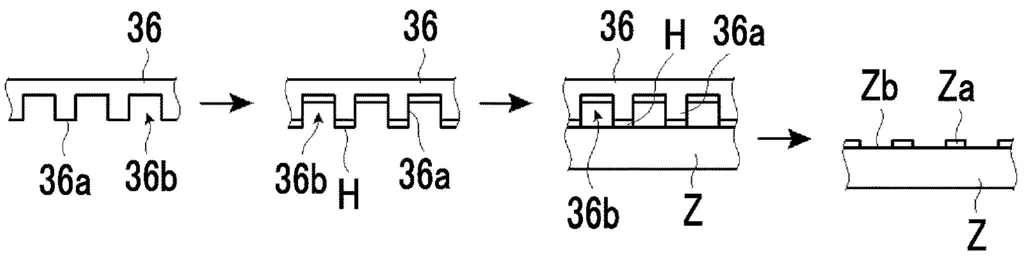
FIG. 3 is a conceptual view for describing an example of a method for forming a liquid-repellent region and a lyophilic region on a base material.

Next, as conceptually shown in FIG. 3, a water repellent H forms a film on an uneven surface of the unevenness precursor 36 by, for example, vapor deposition. Next, the convex portions *36a* of the unevenness precursor 36 on which the film of the water repellent H is formed is abutted to the base material Z of which the entire surface is subjected to the hydrophilic treatment and pressed. Thereafter, by spacing the convex portion *36a* of the unevenness precursor 36 from the base material Z, the water repellent H of the convex portions *36a* is transferred to the base material Z, and the lyophilic/repellent pattern composed of the liquid-repellent region Za and the lyophilic region Zb is formed on the base material Z.

Examples of the water repellent H include a fluorine-based compound and a silicon-based compound. Furthermore, a commercially available water repellent may be used.

Various known film forming methods such as, other than the vapor deposition, a gas phase deposition method such as sputtering and a coating method can be used for forming the film of the water repellent H on the unevenness precursor 36. In addition, the film of the water repellent H may be formed only on distal end surface of the convex portion *36a* by coating, transcription, and the like.

In addition, the transcription of such a water-repellent pattern may be performed using microcontact printing, gravure offset printing, gravure printing, letterpress printing, intaglio printing, offset printing, pad printing, and the like.

In the film forming method according to the embodiment of the present invention, the measuring method of the diameter of the aerosol A is not limited, and various known methods for measuring diameter (particle size) of particles can be used.

Examples thereof include a method for measuring the diameter of the aerosol A by injecting laser sheet light into a space where the aerosol A is present using a laser sheet light source for visualization, capturing an image with a high-speed camera, and analyzing the image. In addition, the particle size of the aerosol A may be measured by visualizing the aerosol A using a commercially available fine particle visualization system. Examples of the commercially available fine particle visualization system include ViEST manufactured by SHIN NIPPON AIR TECHNOLOGIES CO., LTD. At the time of measuring (calculating) the diameter by visualizing the aerosol A, image processing may be performed as necessary.

The measurement position of the diameter of the aerosol A is not limited, but it is preferable to measure the diameter at a position where the aerosol A flows. Therefore, as an example, it is preferable that the diameter of the aerosol A is measured in the guide pipe 16.

In addition, in a case where the raw material liquid M is aerosolized by the ultrasonic vibration, the diameter D of the aerosol A may be obtained by the following equation. In the following equation, ρ indicates the density of the raw material liquid M, σ indicates the surface tension of the raw material liquid M, and f indicates the frequency of the ultrasonic vibration, respectively.

$$D=0.68[(\pi*\sigma)/(\rho*f^2)]^{1/2}$$

The equation is described in J.Accousticai Sot.Amer.34 (1962) 6.

Except for a case where the diameter of the aerosol A unexpectedly changes due to collision and the like of the aerosol A's, it is considered that the diameter of the aerosol A is basically the same from the generation of the aerosol A to the moving in the guide pipe 16 to the arrival at the base material Z.

In addition, it is considered that the diameter of the aerosol A arriving at the base material Z is basically uniform over the entire surface of the base material Z, except for the case where the diameter of the aerosol A unexpectedly changes.

In the film forming method according to the embodiment of the present invention, the diameter D of the aerosol A is not limited, but is preferably 20 to 50 μm, more preferably 10 to 20 μm, and still more preferably 1 to 10 μm.

As described above, the diameter D of aerosol can be adjusted by adjusting one or more of density of the raw material liquid M, surface tension of the raw material liquid M, and frequency of the ultrasonic vibration.

The support 32 is a supporting means for mounting and supporting the base material Z.

In the film forming method according to the embodiment of the present invention, the supporting means for the base material Z is not limited to the support 32 mounting the base material Z, and various known supporting means for a sheet-like material, such as a supporting means for sandwiching an end portion of the sheet-like material, can be used.

In a case of roll-to-roll described later, a roller in a supplying portion (film forming portion) of the aerosol A, which transports the base material Z, a drum (can) in the supplying portion of the aerosol A, which winds and transports the base material Z, and the like act as the supporting means for the base material Z. The roller transporting the base material Z is, for example, a transport roller, a pair of the transport rollers, and the like.

In the film forming method according to the embodiment of the present invention, at the time of supplying the aerosol A, it is preferable that the base material Z is heated. Correspondingly, in the film forming apparatus 10, the support 32 incorporates heating means.

Since the aerosol A moves on the base material Z due to the Leidenfrost phenomenon (Leidenfrost effect) by supplying the aerosol A to the base material Z while heating the base material Z, the moving of the aerosol A from the liquid-repellent region Za to the lyophilic region Zb is promoted, and the patterning accuracy of film formation can be further improved.

The heating temperature of the base material Z is not limited, and it is sufficient that the temperature at which the Leidenfrost phenomenon occurs may be appropriately set according to the solvent used for the raw material liquid M. It is preferable that the heating of the base material Z is performed such that the surface of the base material Z is 100° C. or higher, and it is more preferable that the heating of the base material Z is performed such that the surface of the base material Z is 150° C. or higher.

The heating of the base material Z is preferably performed at a temperature not higher than a temperature at which the base material Z is damaged, according to the forming material of the base material Z.

Here, in a case where the drying of the aerosol A proceeds by heating, the effect of the lyophilic/repellent pattern formed on the base material Z is reduced. In consideration of this point, the surface temperature of the base material Z by heating is preferably 300° C. or lower and more preferably 200° C. or lower.

Furthermore, in consideration of this point, it is preferable that the solvent (dispersion medium) used in the preparation of the raw material liquid M is a liquid having a boiling point of 100° C. or lower, as described above.

As the heating method of the support 32, various known heating methods such as a method using a heater or the like can be used.

In addition, as the heating method of the base material Z, other than the heating of the support 32, various known methods of heating sheet-like material, such as heating by a lamp and direct heating by a heater, can be used.

The film forming apparatus 10 in the drawing includes the vibration device 34 on the lower surface of the support 32. The vibration device 34 is provided as a preferred embodiment, and is a vibration device which vibrates the base material Z at the time of supplying the aerosol A to the base material Z.

In the film forming portion 14, the support 32 is provided so as to be abutted to the bottom surface (inner wall surface) of the casing 30. The vibration device 34 is provided so as to be abutted to the lower surface of the casing 30. Therefore, in a case where the vibration device 34 vibrates the casing 30, the support 32 vibrates, and the base material Z supported by the support 32 vibrates.

The film forming method according to the embodiment of the present invention is a method forming a target patterned film, in film formation by the aerosol deposition, by adhering the aerosol A only to the lyophilic region Zb using the base material Z which has the lyophilic/repellent pattern (liquid-repellent region Za and lyophilic region Zb).

Therefore, by supplying the aerosol A to the base material Z while vibrating the base material Z, the moving of the aerosol A adhering to the liquid-repellent region Za to the lyophilic region Zb is promoted, and the patterning accuracy of film formation can be further improved.

In addition, by supplying the aerosol A to the base material Z while vibrating the base material Z, the film forming speed can be improved.

In the aerosol deposition, a sea-island like film is formed by adhering the aerosol A to the base material Z and drying the aerosol A. Here, the aerosol A not fixed to the base material Z is discharged from the base material Z as rolling down. Therefore, in the aerosol deposition in the related art, a lot of aerosols A are not effectively served for the film formation, and the film forming speed is low. In contrast, by supplying the aerosol A to the base material Z while vibrating the base material Z, it is possible to suppress the aerosol A from rolling down the base material, and by moving the aerosol A on the base material Z and colliding the aerosol A's with each other, liquid droplets of the aerosol A aggregate. As a result, it is considered that the aerosol A is easily fixed on the base material Z and the film forming speed is improved.

In the film forming method according to the embodiment of the present invention, in a case of vibrating the base material Z, the frequency of vibrating the base material Z is not limited.

In order to suitably obtain the effect of vibrating the base material Z, the frequency of vibrating the base material Z is preferably 50 Hz or more, more preferably 100 Hz or more, and still more preferably 200 Hz or more.

In addition, in the film forming method according to the embodiment of the present invention, in a case of vibrating the base material Z, the frequency of vibrating the base material Z is preferably 10 kHz or less, more preferably 5 kHz or less, and still more preferably 1 kHz or less.

In a case where the aerosol A adheres to the base material Z, the aerosol A's are bonded to each other to become a liquid similar to the raw material liquid M. Here, in a case where the base material Z is vibrated at a frequency of more than 10 kHz, the liquid similar to the raw material liquid M adhering to the base material Z is in a state of being ultrasonically vibrated, is aerosolized again and separated from the surface of the base material Z, and the film forming speed may be reduced.

In the film forming method according to the embodiment of the present invention, in a case of vibrating the base material Z, the speed of vibrating the base material Z is not limited.

However, in order to suitably obtain the effect of vibrating the base material Z, it is preferable to vibrate the base material Z at a certain speed or higher. The speed of vibrating the base material Z is preferably 0.1 mm/sec or more, more preferably 0.5 mm/sec or more, and still more preferably 1 mm/sec or more.

On the contrary, in a case where the speed of vibrating the base material Z is too high, problems such as the load on the apparatus increases, the load on the base material Z increases, the aerosol A easily rolls down from the base material Z, and the aerosol A is dried before moving may occur. Therefore, the amplitude of vibrating the base material Z is preferably 10 mm/sec or less, more preferably 8 mm/sec or less, and still more preferably 5 mm/sec.

The vibration device 34 is not limited, and various known vibrating means capable of vibrating the support 32 can be used according to the support 32 supporting the base material Z. In the present invention, the support (supporting means) supporting the base material Z includes the roller in the roll-to-roll as described above.

Examples of the vibration device 34 include a vibration means using a piezo element, a vibration motor (eccentric motor), a vibration means using a movable coil, and a vibration means using a pneumatic actuator, a hydraulic actuator, and the like. In addition, as the vibration device 34, a commercially available vibrator (vibration device) can be also suitably used.

In the film forming method according to the embodiment of the present invention, the vibrating method of the base material Z is not limited to the method for vibrating the supporting means for the base material Z.

For example, in a case where the base material Z is in a state capable of vibrating alone at the supply position of the aerosol A to the base material Z, that is, at the film formation position, such as a case where the base material Z is supported by the supporting means sandwiching the end portion and a case where the base material Z is transported by the pair of the transport rollers in the roll-to-roll described later, blowing means for blowing and vibrating the base material Z, means for irradiating a sound wave on the base material Z to vibrate the base material Z, for example, a speaker, and the like are also suitably used as the vibrating means for the base material Z.

In the film forming method according to the embodiment of the present invention, the timing of starting vibration in a case of vibrating the base material Z is not limited, but it is preferable to start the vibration of the base material Z before supplying the aerosol A to the base material Z. For example, in the film forming apparatus 10 shown in FIG. 1, it is preferable that, after the vibration of the base material Z (support 32) by the vibration device 34 is started, the driving of the ultrasonic vibrator 26 is started, and then the aerosolization of the raw material liquid M is started.

In a case of vibrating the base material Z, in order to suitably obtain the effect of the vibration, it is preferable that the base material Z is always vibrated during a state where the aerosol A is supplied to the base material Z. By starting the vibration of the base material Z before starting the supply of the aerosol A to the base material Z, it is possible to reliably bring the base material Z into a state of vibrating at the time of supplying the aerosol A.

In the film forming method according to the embodiment of the present invention, the base material Z may be vibrated in a surface direction of the main surface of the base material Z, in a direction orthogonal to the main surface of the base material Z, or in both directions of the surface direction of the main surface of the base material Z and the direction orthogonal to the main surface of the base material Z.

In addition, the base material Z may be vibrated in a linear reciprocation, or in a trajectory which draw shapes such as a circle, an ellipse, and a polygonal shape.

Hereinafter, the act of the film forming apparatus 10 shown in FIG. 1 will be described.

In the film forming apparatus 10 shown in FIG. 1, the base material Z on which a liquid-repellent pattern is formed is mounted on the support 32.

Thereafter, in a case where the ultrasonic vibrator 26 ultrasonically vibrates while the raw material container 20 contains the raw material liquid M, ultrasonic waves are transmitted to the raw material liquid M through the water W and the raw material liquid M is ultrasonically vibrated.

By ultrasonically vibrating the raw material liquid M, the raw material liquid M is aerosolized. As a result, the aerosol A generated by aerosolizing the raw material liquid M floats in the raw material container 20.

Next, the carrier gas is supplied from the gas supply means 28 into the raw material container 20 through the gas supply pipe 28*a*. The aerosol A floating in the raw material container 20 is transported from the raw material container 20 to the guide pipe 16 by the carrier gas, and is transported from the guide pipe 16 into the casing 30 of the film forming portion 14. The aerosol A may be concentrated by, for example, heating the guide pipe 16 as necessary.

In a case where the aerosol A is transported into the casing 30 of the film forming portion 14, the aerosol A is supplied to the base material Z which is mounted on the support 32. Furthermore, the solvent evaporates from the aerosol A supplied (adhering) to the base material Z, and the film forming material included in the aerosol A (raw material liquid M) forms a film on the base material Z. The aerosol A not served for the film formation is discharged from the outlet 30*a* of the casing 30.

Here, in the film forming method according to the embodiment of the present invention, the lyophilic/repellent pattern is formed on the base material Z, and the width L of the liquid-repellent region Za and the diameter D of the aerosol A satisfy "$D \geq L/2$".

Therefore, as described above, the aerosol A suitably adheres selectively to the lyophilic region Zb, and as a result, a target patterned film can be formed with high accuracy of patterning. Preferably, by vibrating the base material Z with the vibration device 34 or by heating the base material Z with the heating means incorporated in the support 32, a patterned film with higher accuracy can be formed.

In the film forming method according to the embodiment of the present invention, after forming a film on the base material Z, the formed film may be irradiated with UV, electron beam, and active radiation such as radiations, for example, α-ray, β-ray, γ-ray, and the like as necessary.

For example, in a case where the film forming material is a polymerizable liquid crystal compound, after forming a film on the base material Z, the film may be irradiated with UV to cure (polymerize) the polymerizable liquid crystal compound. Examples of light source generating ultraviolet light include a low-pressure mercury lamp, a medium-pressure mercury lamp, a high-pressure mercury lamp, an ultrahigh-pressure mercury lamp, a carbon arc lamp, a metal halide lamp, a xenon lamp, and LED.

In the film forming method according to the embodiment of the present invention, a film formation by roll-to-roll can be used. In particular, as described above, since the film forming speed can be improved by vibrating the base material Z, the roll-to-roll can be more suitably used by vibrating the base material Z.

As well known, the roll-to-roll is a manufacturing method in which the base material Z is sent out from a base material roll obtained by winding a long base material Z to a roll shape, while transporting the long base material Z in the longitudinal direction, the base material Z is continuously subjected to treatments such as film formation, and the treated base material Z is wound into the roll shape again. By using the roll-to-roll, productivity can be significantly improved.

In the following description, the roll-to-roll is also referred to as "RtoR".

FIG. 4 conceptually shows an example of the film forming method according to the embodiment of the present invention using RtoR. Since the film forming apparatus shown in FIG. 4 uses many of the same members as the film forming apparatus 10 shown in FIG. 1, the same members are denoted by the same reference marks, and the description will mainly be given to different parts.

In a film forming apparatus 40 shown in FIG. 4, the long base material Z is transported in the longitudinal direction (in the drawing, direction of arrow x) by a transport roller 42 and a transport roller 46. A pair of the transport rollers may be used instead of the transport rollers.

A casing 30A in a film forming portion 14A a rectangular housing of which a lower surface is opened. In addition, the vibration device 34 is disposed below the base material Z so as to sandwich the base material Z together with the casing 30A. The casing 30A is provided between the transport roller 42 and the transport roller 46 in the transport direction of the base material Z. Therefore, in the film forming apparatus 40, the transport roller 42 and the transport roller 46 become the supporting means of the base material Z.

In the film forming apparatus 40, while the base material Z having the lyophilic/repellent pattern is transported by the transport roller 42 and the transport roller 46 in the longitudinal direction, a film is formed by supplying the aerosol A when the base material Z passes under the casing 30A.

Preferably, the base material Z is vibrated by the vibration device 34 disposed below the casing 30A. As a result, a patterned film with higher accuracy can be formed and the film forming speed can be improved.

In RtoR, blowing means for blowing and vibrating the base material Z, means for irradiating a sound wave on the base material Z to vibrate the base material Z, for example, a speaker, and the like are suitably used as the vibration device 34, as described above. In addition, the base material Z may be vibrated by vibrating the transport roller 42 and/or the transport roller 46 as the supporting means.

As described above, it is preferable to start the vibration of the base material Z before supplying the aerosol A.

Therefore, in the film forming apparatus 40 in the drawing using RtoR, it is preferable that the vibration device 34 vibrates the base material Z from upstream more than the casing 30A, specifically, it is preferable that the vibration device 34 vibrates the base material Z from immediately downstream of the transport roller 42 on the upstream side.

As described above, the film forming method according to the embodiment of the present invention forms a patterned film on the base material Z having the lyophilic/repellent pattern by the aerosol deposition.

Here, in a case where RtoR is used in the present invention, the formation of the lyophilic/repellent pattern (the liquid-repellent region Za and the lyophilic region Zb) and the film formation by the aerosol deposition may be continuously performed by providing a device forming the lyophilic/repellent pattern upstream of the casing 30A.

Figure 5:
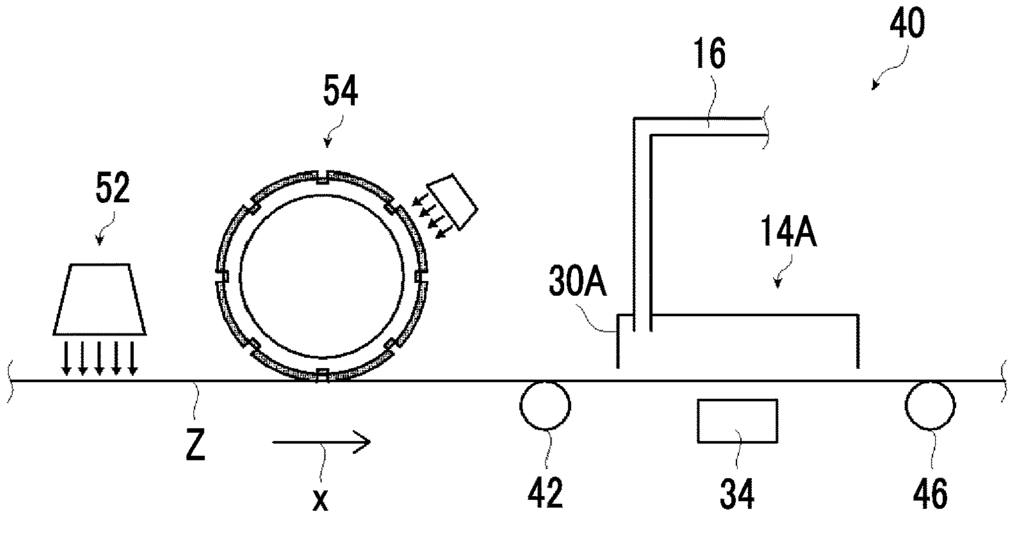
FIG. 5 is a conceptual view for describing another example of the film forming method of the present invention.

For example, as conceptually shown in FIG. 5, a water-repellent pattern transcription device 54 is provided upstream of the film forming apparatus 40 (casing 30A) and a UV ozone treatment device 52 is provided upstream of the water-repellent pattern transcription device 54. In addition, water is used as the solvent of the raw material liquid M.

At this time, while transporting the base material Z in the longitudinal direction (direction of arrow x), first, the entire surface of the base material Z is subjected to a UV ozone treatment using the UV ozone treatment device 52 to be hydrophilized. Next, using the water-repellent pattern transcription device 54, a water-repellent pattern formed by microcontact printing or the like is transferred from the transfer roller 54*a* to the surface of the base material Z of which the entire surface is hydrophilized. As a result, the lyophilic/repellent pattern is formed on the surface of the base material Z.

Thereafter, while transporting the base material Z, by the film forming apparatus 40 according to the film forming method according to the embodiment of the present invention, a film is formed on the base material Z on which the lyophilic/repellent pattern is formed. Thereby, the aerosol A adheres in a pattern only to the hydrophilic region, and the film forming material can form a film with a pattern.

While transporting the sheet-shape (cut sheet-shape) base material Z shown in FIG. 1, of which a plurality are arranged in the transport direction, using a transport means such as a belt conveyor and a roller conveyor, by performing the hydrophilic treatment using the UV ozone treatment device 52 and the transcription of the water-repellent pattern using the water-repellent pattern transcription device 54 on transported base material Z, the manufacturing method as shown in FIG. 5 can also be used to the manufacturing method in which a film is formed by the film forming apparatus 40 which performs the film forming method according to the embodiment of the present invention.

Hereinbefore, the film forming method according to the embodiment of the present invention has been described in detail, but the present invention is not limited to the above-described example and various improvements and changes can be made without departing from the spirit of the present invention.

EXAMPLES

Hereinafter, the features of the present invention will be described more specifically with reference to examples. However, the scope of the present invention is not construed as being limited by the specific examples described below.

Example 1

A raw material liquid having the following composition was prepared.

The density of the prepared raw material liquid was 0.93 g/cm$^3$ and the surface tension thereof was 24 mN/m. The density of the raw material liquid was measured in accordance with JIS Z 8804: 2012. In addition, the surface tension of the raw material liquid was measured by a hanging drop method (pendant drop method).

| | |
|---|---|
| Polymerizable liquid crystal compound (LC-1-1) | 80 parts by mass |
| Polymerizable liquid crystal compound (LC-2) | 20 parts by mass |
| Photopolymerization initiator (manufactured by Chiba Japan Co., Ltd., Irgacure 907) | 3 parts by mass |
| Alignment control agent FP2 | 1 part by mass |
| Alignment auxiliary agent FP3 | 0.4 parts by mass |
| Methyl ethyl ketone | 193 parts by mass |
| Cyclohexanone | 50 parts by mass |

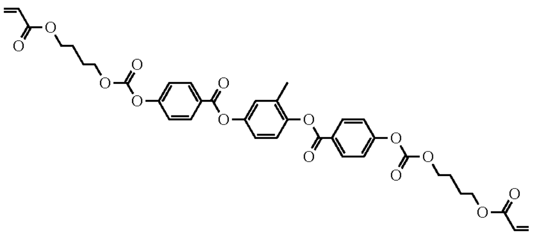

Polymerizable liquid crystal compound (LC-1-1)

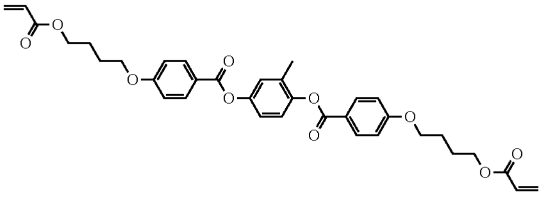

Polymerizable liquid crystal compound (LC-2)

-continued

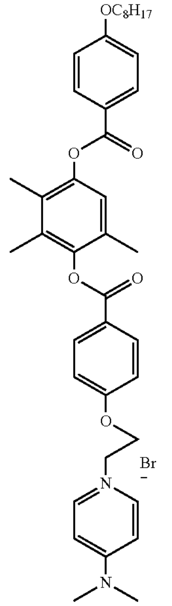

Alignment control agent FP2

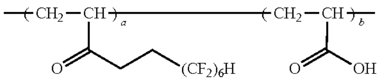

Alignment auxiliary agent FP3

A 100 μm-thick PET film (manufactured by TOYOBO Co., Ltd., COSMOSHINE A4100) was prepared. The PET film was cut into 50×50 mm to obtain a base material.

The surface of the base material was irradiated with UV ozone for 10 seconds using UVO Cleaner 144X (28 mW/cm$^2$) manufactured by Jelight Company Inc., and the entire surface of the base material was subjected to a hydrophilic treatment.

An unevenness precursor shown in FIG. 3 was prepared. The unevenness precursor had a stripe-shape unevenness pattern in which a linear concave portion and a linear convex portion were alternately arranged in parallel in a direction orthogonal to the longitudinal direction. In the unevenness precursor, the width of the convex portion was 1 μm and the width of the concave portion was 3 μm (that is, one pitch of the concave portion and the convex portion was 4 μm), and the depth of the concave portion was 2 μm.

A water repellent (manufactured by DAIKIN INDUSTRIES, Co., Ltd., Optool DSX) was vapor-deposited on the uneven surface of the unevenness precursor. The film thickness of the water repellent was 30 nm.

The unevenness precursor on which a film of the water repellent was formed was pressed onto the hydrophilic treated surface of the base material, and the film of the water repellent which was formed on a distal end surface of the convex portion was transferred to the base material.

As a result, a line-and-space (strip-shape) lyophilic/repellent pattern in which the width of a liquid-repellent region, that is, the diameter of the largest inscribed circle of the liquid-repellent region was 1 μm, and in which the width of the concave portion, that is, the width of the lyophilic region was 3 μm was formed on the surface of the base material.

The base material on which the lyophilic/repellent pattern was formed was mounted on a support of a film forming portion in the film forming apparatus shown in FIG. 1.

LW 139. 141-75 manufactured by ARBROWN Co., Ltd. was used as a vibration device of the film forming portion. Using the vibration device, the base material (support) was vibrated at a frequency of 500 Hz and a vibration speed of 2 mm/sec.

In addition, the support of the film forming portion was heated using a hot plate such that the surface (film forming surface) of the base material was 100° C.

After starting the vibration and heating of the base material, the aerosolization of the raw material liquid was started by vibrating an ultrasonic vibrator of an aerosol generating portion at 1.7 MHz. IM4-36D manufactured by SEIKO GIKEN INC. was used as the ultrasonic vibrator.

Using air as a carrier gas, the generated aerosol was transported from a raw material container to a film forming chamber through a guide pipe. The flow rate of the carrier gas was $2.8\times10^{-3}$ $m^3$/min.

Under these conditions, the aerosol was supplied to the base material for 60 seconds to form a film.

After forming a film for 60 seconds, the base material was taken out of the film forming portion, and heated by blowing hot air at a temperature of 60° C. and a wind speed of 2 m/min for 60 seconds.

Thereafter, the base material was placed on the hot plate at 30° C. and irradiated with UV for 6 seconds under an atmosphere of 300 ppm of an oxygen concentration using a UV irradiator (manufactured by Fusion UV Systems, electrodeless lamp "D bulb", illuminance of 60 mW/$cm^2$) to fix a liquid crystal layer, thereby forming a liquid crystal film.

The thickness of the formed liquid crystal film was 3.5 μm. Using a reflecting spectrographic film thickness meter (manufactured by OTSUKA ELECTRONICS Co., Ltd, FE 3000), the film thickness of the lyophilic region was measured as the film thickness of the liquid crystal film. Regard this point, the same applies to other examples.

In addition, in a case of calculating the diameter of the aerosol using $D=0.68[(\pi*\sigma)/(\rho*f^2)]^{1/2}$ described above, the diameter of the aerosol was 2 μm.

Examples 2 to 4

Liquid crystal films were formed in the same manner as in Example 1, except that, the widths of the convex portion, that is, the widths of the liquid-repellent region in the unevenness precursors were changed to 2 μm (Example 2), 3 μm (Example 3), and 4 μm (Example 4).

Example 5

A liquid crystal film was formed in the same manner as in Example 1, except that the frequency of the ultrasonic vibrator was changed to 0.7 MHz.

In a case of calculating the diameter of the aerosol using the equation described above, the diameter of the aerosol was 3.7 μm.

Example 6

A liquid crystal film was formed in the same manner as in Example 1, except that the frequency of the ultrasonic vibrator was changed to 0.6 MHz and the width of the convex portion, that is, the width of the liquid-repellent region in the unevenness precursor was changed to 8 μm.

In a case of calculating the diameter of the aerosol using the equation described above, the diameter of the aerosol was 4.1 μm.

Example 7

A liquid crystal film was formed in the same manner as in Example 1, except that the base material was not heated and the width of the convex portion, that is, the width of the liquid-repellent region in the unevenness precursor was changed to 4 μm.

Example 8

A liquid crystal film was formed in the same manner as in Example 1, except that the base material was not vibrated and the width of the convex portion, that is, the width of the liquid-repellent region in the unevenness precursor was changed to 4 μm.

Example 9

A liquid crystal film was formed in the same manner as in Example 1, except that the base material was not heated and not vibrated, and the width of the convex portion, that is, the width of the liquid-repellent region in the unevenness precursor was changed to 4 μm.

Comparative Example 1

A liquid crystal film was formed in the same manner as in Example 1, except that the width of the convex portion, that is, the width of the liquid-repellent region in the unevenness precursor was changed to 8 μm, and the base material was not vibrated and heated.

Comparative Example 2

A liquid crystal film was formed in the same manner as in Example 1, except that the width of the convex portion, that is, the width of the liquid-repellent region in the unevenness precursor was changed to 8 μm.

[Evaluation]

The produced liquid crystal films were observed and photographed with a microscope, the observed image was subjected to image analysis, the area occupied by the liquid crystal in the liquid-repellent region (water-repellent region) was calculated, and a liquid crystal adhesion rate was calculated.

In the image analysis, the area was automatically calculated by surrounding the contour of the image of the liquid crystal portion in the liquid-repellent region using ImageJ which is free software (open source software), and the proportion of the area occupied by the liquid crystal in the liquid-repellent region was obtained and defined as the liquid crystal adhesion rate.

A case where the liquid crystal adhesion rate is less than 1% was evaluated as very good;

a case where the liquid crystal adhesion rate is 1% or more and 5% or less was evaluated as good;

a case where the liquid crystal adhesion rate is more than 5% and 10% or less was evaluated as slightly good; and a case where the liquid crystal adhesion rate is more than 10% was evaluated as poor.

The results are shown in the table.

TABLE 1

| | Diameter of aerosol [μm] | Liquid-repellent region Width [μm] | Width/2 [μm] | Base material Vibration frequency | Heating temperature [° C.] | Film thickness [μm] | Evaluation |
|---|---|---|---|---|---|---|---|
| Example 1 | 2 | 1 | 0.5 | 500 Hz | 100 | 3.5 | Very good |
| Example 2 | 2 | 2 | 1 | 500 Hz | 100 | 4.7 | Very good |
| Example 3 | 2 | 3 | 1.5 | 500 Hz | 100 | 5.8 | Very good |
| Example 4 | 2 | 4 | 2 | 500 Hz | 100 | 6.9 | Very good |
| Example 5 | 3.7 | 1 | 0.5 | 500 Hz | 100 | 3.5 | Very good |
| Example 6 | 4.1 | 8 | 4 | 500 Hz | 100 | 11.6 | Very good |
| Example 7 | 2 | 4 | 2 | 500 Hz | Not heating | 5.9 | Good |
| Example 8 | 2 | 4 | 2 | Not vibrating | 100 | 0.7 | Good |
| Example 9 | 2 | 4 | 2 | Not vibrating | Not heating | 0.6 | Slightly good |
| Comparative Example 1 | 2 | 8 | 4 | Not vibrating | Not heating | 0.5 | Poor |
| Comparative Example 2 | 2 | 8 | 4 | 500 Hz | 100 | 8.2 | Poor |

As shown in Table 1, according to the film forming method according to the embodiment of the present invention in which the width L of the liquid-repellent region and the diameter D of the aerosol satisfy "D≥L/2", the aerosol adhering to the liquid-repellent region, that is, the amount of the film forming material which forms a film on the liquid-repellent region is significantly suppressed, and a patterned film with high accuracy can be formed. In particular, in Examples 1, 2, and 5 in which the width L of the liquid-repellent region and the diameter D of the aerosol satisfy "D≥L", the amount of the liquid crystal (film forming material) adhering to the liquid-repellent region can be very suitably suppressed and the liquid crystal adhesion rate in the water-repellent region was almost 0%.

From the comparison between Examples 7 to 9 and the other examples, by supplying the aerosol while vibrating the base material, or by supplying the aerosol while heating the base material, it is possible to prevent the aerosol (film forming material) from adhering to the liquid-repellent region and have a pattern with high accuracy.

In contrast, in the comparative examples in which the width L of the liquid-repellent region and the diameter D of the aerosol do not satisfy "D≥L/2", a lot of the aerosol, that is, the film forming material adheres to the liquid-repellent region, and a patterned film with high accuracy cannot be formed.

For example, the present invention can be suitably used for manufacturing optical elements, manufacturing semiconductor elements, manufacturing electric elements, manufacturing solar cells, and the like.

EXPLANATION OF REFERENCE

10, 40: film forming apparatus
12: aerosol generating portion
14, 14A: film forming portion
16: guide pipe
20: raw material container
24: container
26: ultrasonic vibrator
28: gas supply means
28*a*: gas supply pipe
30, 30A: casing
32: support
34: vibration device
36: unevenness precursor
36*a*: convex portion
36*b*: concave portion
42, 46: transport roller
52: UV ozone treatment device
54: water-repellent pattern transcription device
A: aerosol
M: raw material liquid
W: water
Z: base material
Za: liquid-repellent region
Zb: lyophilic region

What is claimed is:

1. A film forming method comprising:
aerosolizing a raw material liquid including a film forming material;
supplying the aerosol to a base material; and
forming a film of the film forming material on the base material,
wherein the base material has, on a film forming surface, a liquid-repellent region which has liquid repellency to the raw material liquid and a lyophilic region which has lyophilicity to the raw material liquid, and
in a case where a width of the liquid-repellent region is L and a diameter of the aerosol is D, D>L is satisfied, and
wherein the aerosol is supplied to the base material while vibrating the base material at a frequency of 10 kHz or less.

2. The film forming method according to claim 1,
wherein the aerosol is supplied to the base material while heating the base material.

3. The film forming method according to claim 2,
wherein the base material is heated such that a temperature of a surface of the base material is 100° C. or higher.

4. The film forming method according to claim 3,
wherein a boiling point of a solvent or a dispersion medium included in the raw material liquid is 100° C. or lower.

5. The film forming method according to claim 2, wherein a boiling point of a solvent or a dispersion medium included in the raw material liquid is 100° C. or lower.

6. The film forming method according to claim 1, wherein the lyophilic region and the liquid-repellent region on the film forming surface of the base material are formed by performing lyophilic treatment on an entire surface of one side of the base material and then forming a pattern having liquid repellency to the raw material liquid.

7. The film forming method according to claim 1, wherein the lyophilic region and the liquid-repellent region form a wiring pattern.

8. The film forming method according to claim 7, wherein the wiring pattern is a line-and-space wiring pattern.

9. The film forming method according to claim 1, wherein the film forming material is a conductive material.

* * * * *